US006664560B2

(12) United States Patent
Emerson et al.

(10) Patent No.: US 6,664,560 B2
(45) Date of Patent: Dec. 16, 2003

(54) ULTRAVIOLET LIGHT EMITTING DIODE

(75) Inventors: David Todd Emerson, Durham, NC (US); Amber Christine Abare, Cary, NC (US); Michael John Bergmann, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/170,577

(22) Filed: Jun. 12, 2002

(65) Prior Publication Data

US 2003/0020061 A1 Jan. 30, 2003

Related U.S. Application Data

(60) Provisional application No. 60/298,835, filed on Jun. 15, 2001.

(51) Int. Cl.$^7$ ............................................... H01L 29/06
(52) U.S. Cl. ............................... 257/14; 257/79; 257/94; 257/103; 257/13
(58) Field of Search .............................. 257/13, 14, 15, 257/22, 79, 88, 89, 94, 103, 77

(56) References Cited

U.S. PATENT DOCUMENTS

| | | | |
|---|---|---|---|
| 4,866,005 | A | 9/1989 | Davis et al. |
| 4,918,497 | A | 4/1990 | Edmond |
| 5,027,168 | A | 6/1991 | Edmond |
| RE34,861 | E | 2/1995 | Davis et al. |
| 5,393,993 | A | 2/1995 | Edmond et al. |
| 5,523,589 | A | 6/1996 | Edmond et al. |
| 5,585,648 | A | 12/1996 | Tischler |
| 5,661,074 | A | 8/1997 | Tischler |
| 5,874,747 | A | 2/1999 | Redwing et al. |
| 5,939,732 | A | 8/1999 | Kurtz et al. |
| 6,051,849 | A | 4/2000 | Davis et al. |
| 6,177,168 | B1 | 1/2001 | Stevens |
| 6,210,987 | B1 | 4/2001 | Kurtz et al. |
| 6,306,675 | B1 | 10/2001 | Tsong et al. |
| 2002/0093020 | A1 | 7/2002 | Edmond et al. |
| 2003/0006418 | A1 * | 1/2003 | Emerson et al. .............. 257/79 |

FOREIGN PATENT DOCUMENTS

| | | |
|---|---|---|
| DE | 19955747 A1 | 5/2001 |
| EP | 1063711 A1 | 12/2000 |
| JP | 11-330552 | 11/1999 |
| JP | 2001-024223 | 1/2001 |
| JP | 2001-060719 | 3/2001 |
| WO | WO 99/18617 A1 | 4/1999 |
| WO | WO 00/58999 A2 | 10/2000 |

OTHER PUBLICATIONS

Nakamura,, Shuki; InGaN Multiquantum–Well–Structure laser Diodes with GaN–AlGaN Modulation–Doped Strained–Layer Superlattices; IEEE Journal of Selected Topics in Quantum Electronics, May/Jun. 1998, vol. 4, No. 3, pp. 483–489.

Nakamura, S.; III–V nitride–based light–emitting diodes; Diamond and Related Materials5 (1996), vol. 5, No. 3–5, pp. 496–500; Elsevier Science Publishers, Amsterdam , NL.

* cited by examiner

*Primary Examiner*—Mark V. Prenty
(74) *Attorney, Agent, or Firm*—Summa & Allan, P.A.

(57) ABSTRACT

A light emitting diode is disclosed. The diode includes a silicon carbide substrate having a first conductivity type, a first gallium nitride layer above the SiC substrate having the same conductivity type as the substrate, a superlattice on the GaN layer formed of a plurality of repeating sets of alternating layers selected from among GaN, InGaN, and AlInGaN, a second GaN layer on the superlattice having the same conductivity type as the first GaN layer, a multiple quantum well on the second GaN layer, a third GaN layer on the multiple quantum well, a contact structure on the third GaN layer having the opposite conductivity type from the substrate and the first GaN layer, an ohmic contact to the SiC substrate, and an ohmic contact to the contact structure.

72 Claims, 4 Drawing Sheets

ULTRAVIOLET LIGHT EMITTING DIODE

This application claims priority from provisional application Serial No. 60/298,835 filed Jun. 15, 2001, for "Ultraviolet Light Emitting Diode." The present invention relates to light emitting diodes (LEDs) and in particular relates to a light emitting diode formed from Group III nitrides that emit in the ultraviolet (UV) portion of the electromagnetic spectrum. This application is related to the following copending applications, each of which is incorporated entirely herein by reference: Ser. No. 60/294,445 filed May 30, 2001, for "Multi-Quantum Well Light Emitting Diode Structure," Ser. No. 60/294,308 filed May 30, 2001, for "Light Emitting Diode Structure with Multi-Quantum Well and Superlattice Structure," and Ser. No. 09/706,057 filed Nov. 3, 2000, for "Group III Nitride Light Emitting Devices with Gallium-Free Layers."

FIELD OF THE INVENTION

BACKGROUND OF THE INVENTION

The present invention relates to light emitting diodes. As well understood by those of ordinary skill in this art, in its most basic form a light emitting diode is formed of one or more semiconductor materials that includes at least one p-n junction (the diode) and which emits light (photons) of a particular color when current passes (is injected) through the device.

Because light emitting diodes are formed from semiconductor materials, they represent one group of "solid state" devices; i.e., those electrical or electronic devices formed in solid compositions, and that operate without the use of flow of electrons through a gas or a vacuum that characterized a much earlier generation of electronic equipment such as vacuum tubes. In an increasingly large number of electronic applications, solid state devices are overwhelmingly preferred because of their relatively low cost, high reliability, small size, light weight, and the derivative advantages that these provide.

In particular, light emitting diodes have become almost ubiquitous in their appearance in devices of all types. In recent years, the availability of light emitting diodes that will emit in the blue portion of the visible spectrum has expanded yet again the available applications for light emitting diodes. In addition to providing blue light per se, blue LEDs with the appropriate wavelengths (about 455–492 nanometers), can be incorporated with LEDs of the other primary colors (red and green, both of which have generally been more widely available than blue) to form multiple combinations of visible colors for many purposes. Indeed, the availability of all three primary colors in light emitting diodes has opened the possibility for solid state production of white light (i.e., the combination of all the primary colors), and such devices are increasingly available in the consumer marketplace as well as other areas of commerce.

As is further understood by those of skill in this art, the color that an LED produces is based on a number of factors, but primarily depends upon the bandgap of the semiconductor material being used, often combined with various doping schemes, including compensated doping schemes. The material being used is the fundamental factor, however, because the material's full bandgap represents the limiting factor in the energy transitions that can produce a photon. Thus, materials with smaller bandgaps cannot produce photons having sufficient energy (and corresponding wavelength and frequency) to fall into the higher energy (blue and violet) portion of the visible spectrum. In particular, in order to produce a blue photon, a material must have a band gap of at least 2.5 eV (e.g. for a 492 nm photon), and only a relatively few semiconductor materials meet this criteria. Among these are the Group III nitrides, silicon carbide (SiC), and diamond.

Although much interest and success in blue LEDs has focused upon silicon carbide based devices, Group III nitrides have raised more recent and greater interest because of their characteristics as direct rather than indirect emitters. In somewhat simplistic terms, a direct emitter produces a photon that incorporates all of the energy of the bandgap transition, while an indirect emitter emits some of the transition energy as a photon and some as vibrational energy (a phonon). Thus, a direct transition is more efficient than an indirect one in an LED. Additionally, the bandgap of Group III nitride materials can be tailored somewhat by the atomic composition of the nitride. Thus, blue light emitting diodes are generally formed in combinations of gallium nitride, aluminum nitride, indium nitride, and various ternary and tertiary versions of these materials. In particular, indium gallium nitride is an attractive candidate because its bandgap can be tuned by adjusting the amount of indium present.

Although the blue LED has expanded the universe of LED applications, its use can be to some extent limited in producing white light for other, more mundane reasons. For example, in order to produce white light from the red-green-blue combination, a lamp or pixel must incorporate a red LED, a blue LED and a green LED. Additionally, producing the necessary circuitry and physical arrangements to house and operate three LEDs is more complex than for single-color LEDs when they are incorporated into devices.

Accordingly, recent interest has focused upon the use of single color LEDs in combination with fluorescent and phosphorescent materials to produce desired colors from single LEDs. Although many materials respond in fluorescent or phosphorescent fashion to light in the visible spectrum, and thus will respond to visible LEDs, more tend to respond to the higher-energy photons in the ultraviolet portion of the spectrum. Furthermore, certain visible LED-phosphor combinations raise particular disadvantages. For example, a relatively high energy photon from a blue LED will produce phosphorescence in a number of materials, including phosphorescence of white light. Because the blue LED is stimulating the phosphorescence, however, the light always tends to have a blue component in it that may be undesired in a given application.

Accordingly, the use of ultraviolet (UV) LEDs as the excitation source for fluorescent or phosphorescent lighting has become of greater interest. In theory, a single UV LED that produces an appropriate wavelength and frequency emission can produce a suitable white light emission from a complementary phosphor. Stated differently, by incorporating the phosphor, the single UV LED can produce the same white light that would otherwise require the use of separate red, green and blue LEDs. Present examples include potential back-lighting for liquid crystal display devices such as cell phone displays. Furthermore, the production of white light from single LEDs offers advantages in any number of applications including room and outdoor lighting. Therefore, producing and improving light emitting diodes that can emit in an efficient and satisfactory manner in the UV portion of the spectrum remains a desirable goal.

OBJECT AND SUMMARY OF THE INVENTION

Therefore, it is an object of the present invention to provide a light emitting diode that can produce frequencies in the ultraviolet portion of the electromagnetic spectrum and that can be incorporated into related devices and equipment, including devices that use phosphors in combination with the LED to produce white light.

The invention meets this object with a light emitting diode that emits in the UV portion of the electromagnetic spectrum.

In another aspect, the invention is the combination of the LED with an appropriate phosphor to produce a device that emits white light.

In yet another aspect, the invention is a method of producing the UV light emitting diode.

The foregoing and other objects and advantages of the invention and the manner in which the same are accomplished will become clear based on the followed detailed description taken in conjunction with the accompanying drawings in which:

DETAILED DESCRIPTION OF THE PREFERRED EMBODIMENTS

Figure 1:
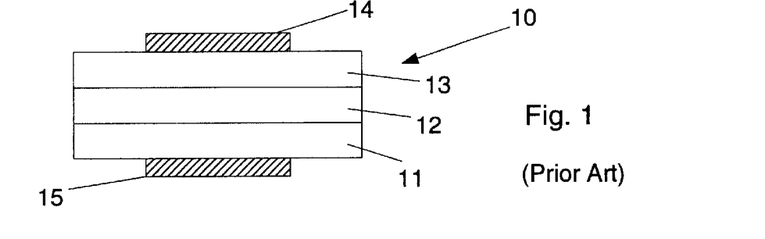
FIG. 1 is a schematic diagram of a light-emitting diode in its basic form as exemplified by the prior art.

FIG. 1 is a schematic cross sectional diagram of a simple conventional LED in the prior art. The LED 10 is formed of a substrate 11, and then respective n and p-type epitaxial layers 12 and 13 that form the p-n junction. Ohmic contacts 14 and 15 complete the device in situations where the substrate 11 is conductive. An exemplary blue LED formed in silicon carbide having a generally similar structure is set forth in U.S. Pat. Nos. 4,918,497 and 5,027,168 which are commonly assigned with the present invention. In a device using silicon carbide, the substrate 11 is typically n-type as is the first epitaxial layer 12. The top epitaxial layer 13 is p-type. As set forth in the above patents and numerous others, one of the advantages of silicon carbide as a substrate is its capability of being conductively doped to thus permit the vertical orientation of the device illustrated in FIG. 1. As used in this art, the term "vertical" indicates that the ohmic contacts 14 and 15 are placed at opposite ends of the device so that current can flow through the device in end-to-end fashion rather than laterally, as in LED's that incorporate non-conductive substrates such as sapphire. In its simplest operation, when current is passed through the LED 10, holes and electrons from the layers 12 and 13 combine and give off energy in the form of photons. When the bandgaps or other aspects of the device (such as compensated doping) define the proper energy separations, the photons will be in the visible portion of electromagnetic spectrum and thus form visible light. In the same manner, of course, smaller-energy transitions can produce lower-energy photons that fall into the infrared portion of the spectrum, and larger-energy transitions can—as in the present invention—produce higher-energy photons that fall into the blue, violet, and ultraviolet portions of the spectrum.

Figure 2:
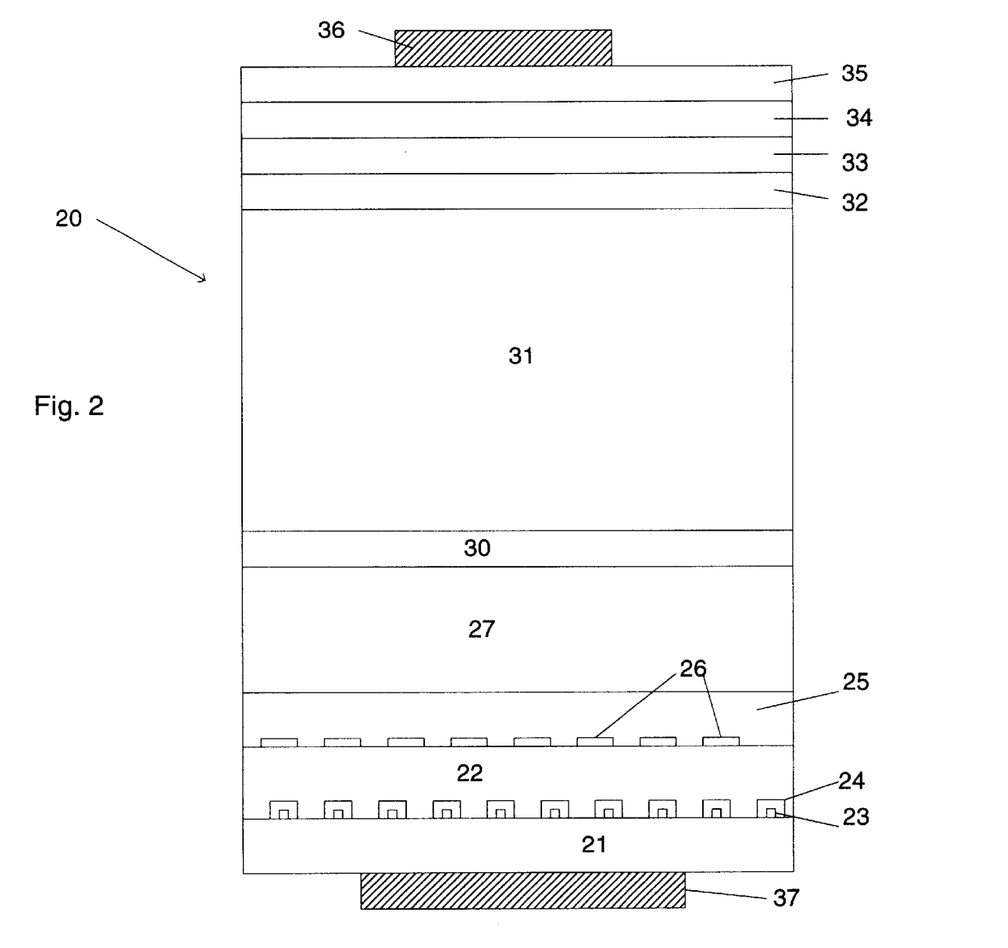
FIG. 2 is a schematic cross-sectional view of the light-emitting diode of the present invention.

FIG. 2 schematically illustrates the present invention in cross sectional fashion and generally designated at 20. In a broad overview, the device 20 is formed on a silicon carbide substrate 21. In preferred embodiments, the substrate 21 is formed from the 6H or 4H polytypes of SiC, with 4H being most preferred for its better electrical proprieties and transparency to UV wavelengths. By comparison, the 6H polytype tends to absorb in the UV region of the spectrum.

The substrate 21 carries an aluminum gallium nitride (AlGaN) buffer layer 22 that provides a crystal and electronic transition between the silicon carbide substrate 21 and its lattice parameters and those of the remainder of the device. As used herein, the formula AlGaN represents the more complete designation $Al_xGa_{1-x}N$ in which $1 \geq X \geq 0$. Exemplary buffer structures and compositions are set forth in U.S. Pat. Nos. 5,393,993 and 5,523,589, the contents of which are incorporated entirely herein by reference. Table 1 presents preferred thickness ranges for the buffer layer 22 and the remaining layers shown in FIG. 2. Although the buffer layer 22 forms an element of a preferred embodiment of the invention, it is an optional element.

FIG. 2 also illustrates that the buffer layer 22 also includes a plurality of gallium nitride dots 23 on the surface of the silicon carbide substrate, with the dots 23 in turn being covered with AlGaN caps 24. Thus, the buffer layer 22 can also be described as being on the dots 23 and their caps 24. Similarly, the gallium nitride dots 23 and the AlGaN caps 24 are not required elements but form elements of a preferred embodiment of the invention.

The next layer is a gallium nitride (GaN) layer 25 which is doped with silicon to be n-type, thus matching the preferred n-type silicon carbide substrate, and permitting the overall vertical orientation of the device 20. The gallium nitride layer 25 also includes a discontinuous layer of silicon nitride ($Si_3N_4$) which is illustrated in schematic fashion by the rectangles 26. It will be understood that the rectangles 26 are a schematic representation and that the layer is discontinuous and not limited to specific geometric shapes. Thus, the GaN layer 25 can also be described as being on both the buffer 22 and the discontinuous $Si_3N_4$ layer 26.

Although FIG. 2 illustrates the silicon nitride layer 26 as being on the top surface of the AlGaN buffer layer 22, this position is preferred and exemplary rather than limiting of the invention. In a broader sense, the silicon nitride layer 26 should be below the active layer, should be capped with a AlGaN layer or GaN layer to complete its defect reduction purpose.

The silicon nitride layer 26 functions to reduce the propagation of dislocations in the crystal that tend to originate in the SiC substrate 21. Such dislocations tend to propagate through Group III nitride layers, but not through the $Si_3N_4$ portions (epitaxial lateral overgrowth) in a manner that prevents the dislocations from reproducing. In practice, the $Si_3N_4$ layer 26 can reduce the defect density. Thus, although the silicon nitride layer is not a required element of the invention, it does form an element of the preferred embodiment.

The next portions of the device are the superlattice broadly designated at 27 in FIG. 2 (and that will be discussed in more detail with respect to FIG. 3) and the n-type doped gallium nitride layer 30 on the superlattice 27. This layer provides an appropriate transition to the multiple quantum well ("MQW") 31 (FIG. 4). In preferred embodiments, the layer 30 includes both a doped and undoped portion. The doped portion is n-type and about 250 Å thick (see Table 1) and is immediately adjacent the superlattice 27. The undoped portion is about 35 Å thick and preferably borders the MQW 31. Avoiding doping this portion of layer 30 helps protect the InGaN portion of the first period of the MQW from undesired doping.

The multiple quantum well 31 is capped by another gallium nitride layer 32 which in preferred embodiments is undoped but can be p-doped with magnesium or n-doped with silicon. The next layer is a similarly undoped aluminum gallium nitride layer 33, followed by the p-type aluminum gallium nitride ($Al_xGa_{1-x}N$, where $1 \geq x \geq 0$) layer 34 and p-type GaN contact layer 35. Ohmic contacts 36 to the p-type contact layer 35 and 37 to the substrate 21 respectively, complete the device. The contact layer 35 is preferably formed of GaN because it provides a better ohmic contact than AlGaN, but is less difficult to form than InGaN, which has the best theoretical properties for the p-contact layer 35. The preferred GaN contact does not limit the contact to GaN, a suitable InGaN or superlattice layers are also possible contact layers.

Figure 3:
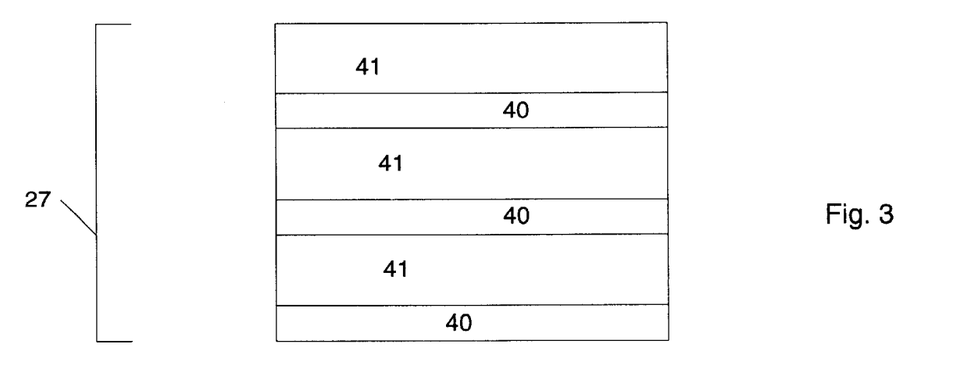
FIG. 3 is an expanded cross-sectional view of the superlattice portion of the device illustrated in FIG. 2.
Figure 4:
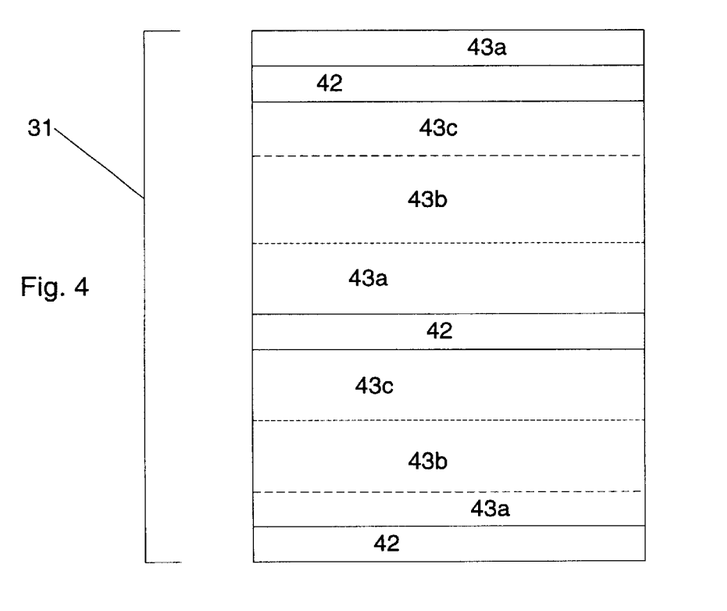
FIG. 4 is an enlarged schematic cross-sectional view of the multiple quantum well portion of the device illustrated in FIG. 2.

FIG. 3 is an enlarged view of the superlattice structure 27. In preferred embodiments, the superlattice 27 is formed of a plurality of repeating sets ("periods") of alternating layers of indium gallium nitride (InGaN) 40 and gallium nitride 41, respectively. In other embodiments, the alternating layers can both be InGaN, with different mole fraction combinations of indium and gallium. In yet another embodiment, the alternating layers can be AlGaInN with different mole fractions of aluminum, gallium and indium. FIG. 3 illustrates three periods of the superlattice 27 and in preferred embodiments, the device can include up to 50 such periods. In the preferred embodiments, the InGaN layers 40 are about 10 Å thick and the gallium nitride layers are about 20 Å thick. Both of the layers are doped n type with silicon.

To some extent, the advantages provided by the superlattice 27 are empirically observed rather than theoretically understood. Thus, Applicants do not wish to be bound by any particular theory about the superlattice, but have determined that the resulting light emitting diode demonstrates improved performance, particularly brightness, when the superlattice 27 is included. It is recognized that in at least one sense, the superlattice provides strain relief and helps bridge the lattice constant gap between the gallium nitride portions of the device and the indium gallium nitride layers in the multiple quantum well 31. The superlattice 27 also increases the effective carrier concentration and reduces the voltage required for the device, thus improving both its optical quality and the efficiency.

FIG. 4 is an enlarged and more detailed schematic cross-sectional view of the multiple quantum well 31 illustrated in FIG. 2. As in the case of the superlattice 27, the multiple quantum well includes a number of repetitions of a basic structure formed of a layer of undoped indium gallium nitride, which in FIG. 4 are each respectfully illustrated at 42, and layers of gallium nitride each illustrated at 43. The indium gallium nitride portions 42 are undoped and, having the smallest bandgap of all of the materials in the device, form the quantum well in which the carrier density is highest. Although the inventors do not wish to be bound by any particular theory, it appears that undoped InGaN tends—all other factors being equal—to be of higher quality than doped InGaN. Thus undoped InGaN represents the presently preferred embodiment of the invention, but is not an absolute limitation.

Furthermore, although the periods formed of GaN and InGaN represent the preferred and illustrated embodiment, it will be understood that in a broader sense the alternating layers can be expressed as $In_xGa_{1-x}N$ alternating with $In_yGa_{1-y}N$ where $1 \geq X \geq 0$ and $1 \geq Y \geq 0$ or alternatively a quartenary $Al_xIn_yGa_{1-x-y}N$ where $X+Y<1$. In such cases, the values of X and Y are selected to make sure that the quantum wells 42 have smaller bandgaps than the layers 43.

Figure 5:
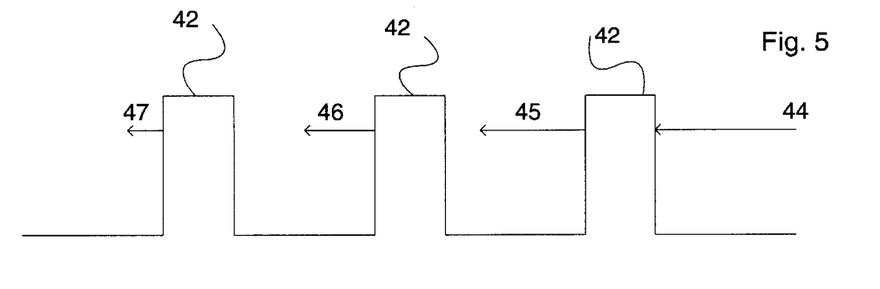
FIG. 5 is an abbreviated bandgap diagram illustrating the function of the multiple quantum well.

In preferred embodiments, each of the gallium nitride layers 43 is formed of three respective portions. A first portion, 43A, is not intentionally doped. A second portion, 43B, is n-type doped with silicon. A third portion, 43C, is not intentionally doped. The purpose of layers 43A and 43C is to provide an undoped region immediately adjacent the undoped indium gallium nitride well layer 42. Although the structure and purpose of multiple quantum wells is generally well understood in this art, the purpose of including the quantum well is to some extent illustrated by the partial bandgap diagram of FIG. 5. In FIG. 5, a series of arrows is shown to indicate the flow of carriers (holes in FIG. 5) through the quantum wells. As the carriers reach each well, a portion of the number that is injected will be collected in each well, but a portion will not be. Thus the initial number of carriers is illustrated by the largest arrow 44 in FIG. 5, progressing through the first quantum well formed by the indium gallium nitride layer 42. The carriers that are not collected in the first quantum well 42, are indicated by the somewhat smaller arrow 45 (moving from right to left in the orientation of FIG. 5). Once again, fewer carriers remain after the next quantum well and this smaller number is indicated by the arrow 46. Finally, the fewest number of carriers after the last quantum well are illustrated by the arrow 47.

In some cases, a single quantum well is advantageous and can form the active layer of the present invention, i.e, where the light is produced. The use of a plurality of quantum wells 42, however, rather than a single quantum well, helps collect and in effect use, as many available carriers as possible thus increasing the efficiency of the device in comparison to a single layer structure of the same material. At some point, however, after most of the carriers have been collected, additional wells will no longer provide a proportional increase in efficiency. Additionally, indium gallium nitride is a strained crystal structure relative to gallium nitride and even though the layers are relatively thin, the strain in the multiple quantum well becomes cumulative. Thus the number of quantum wells is generally selected as sufficient to increase the efficiency while less than the number at which the strain would become troublesome, and the gain in efficiency would likewise become minimal or nonexistent. Presently, successful devices have been formed using a three-period well, a five-period well and a seven-period well, and those of skill in the art will be able to select other numbers of periods without departing from the scope of the invention or the claims.

Figure 6:
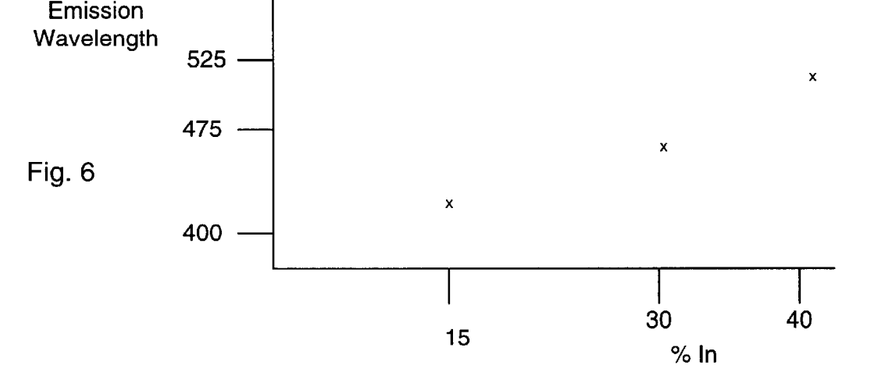
FIG. 6 is a schematic plot of the relationship between the emission wavelength of a diode according to the present invention and the percentage of indium in an indium gallium nitride quantum well of fixed thickness.
Figure 7:
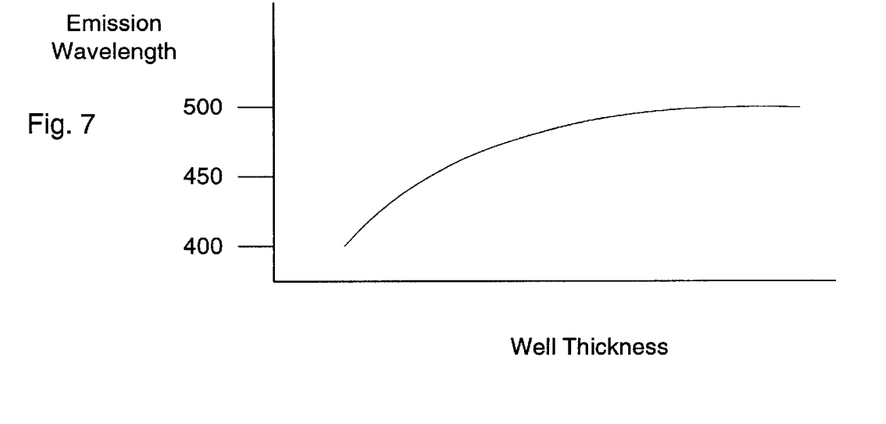
FIG. 7 is a schematic plot of the emission wavelength in relation to the thickness of the quantum well for a fixed percentage of indium in the indium gallium nitride quantum well.

FIGS. 6 and 7 are schematic diagrams that illustrate the relationship between the emission wavelength of the quantum well and (1) the percentage of indium in the well (FIG.

6) or (2) the well thickness (FIG. 7). As known to those familiar with indium gallium nitride, the bandgap of this ternary material can be adjusted by changing the amount of indium in the crystal. In this regard, and as also well-understood in this art, the formula for indium gallium nitride is best expressed as $In_XGa_{X-1}N$, where $1>X>0$.

As FIG. 6 illustrates, for a fixed thickness well, an increasing amount of indium (as mole percentage) tends to increase the wavelength and thus lower the frequency of the photons emitted by the device. Lesser fractions of indium cause the device to emit a shorter wavelength, higher frequency photon in the desired UV range. Accordingly, in preferred embodiments of the invention, X is equal to about 0.15; i.e., $In_{0.15}Ga_{0.85}N$.

FIG. 7 illustrates that, for a fixed amount of indium, the well thickness affects the wavelength. Table 2 presents the preferred ranges of well thickness and in preferred embodiments, the well is about 25 angstroms thick.

Thus, in order to produce a UV emission, the percentage (mole fraction) of indium in the InGaN quantum wells 42 is preferably no more than 30% and most preferably about 15%. Similarly, the thickness of the wells is preferably no more than about 50 angstroms, and most preferably about 25 angstroms.

The resulting LEDs have been produced with wavelengths between 370 nm and 420 nm depending upon the design parameters set forth herein.

Figure 8:
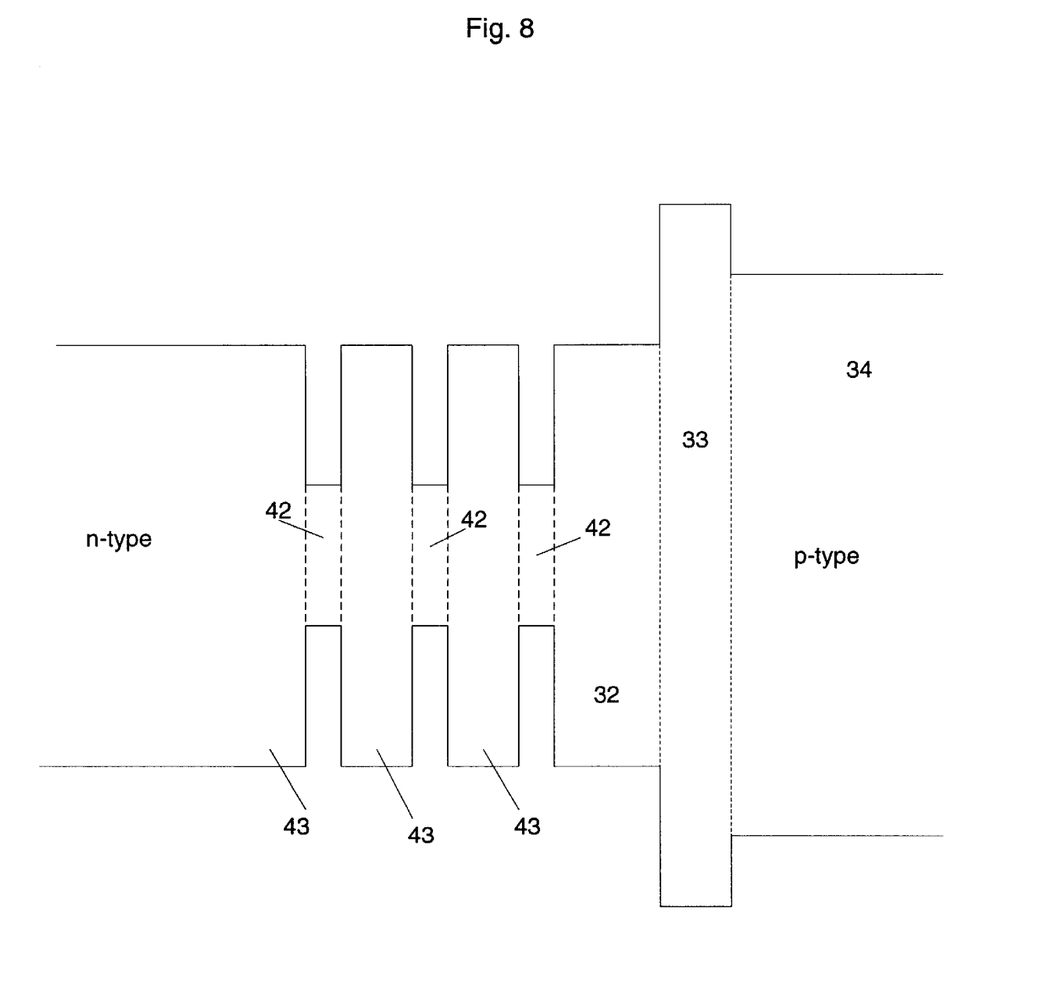
FIG. 8 is a more complete bandgap diagram of illustrative portions of the light-emitting diode according to the present invention.

FIG. 8 is a schematic band gap diagram of the relevant portions of the light emitting diode of the present invention. The upper border of the diagram represents the conduction band and the lower portion represents the valence band.

Method Aspects of the Invention:

There are a number of distinct steps in producing the light emitting diode of the present invention. As those of skill in this art are aware, the growth of epitaxial layers of materials such as Group III nitrides is a relatively sophisticated task. To some extent, the particular growth conditions and techniques are dependent upon factors such as the particular reactors (and related facilities and equipment) being used. Thus, the description herein provides the information necessary for those of skill in this art to carry out the disclosed and claimed techniques under individual or different circumstances, yet without undue experimentation.

The substrate 21 is generally formed in the manner set forth in U.S. Pat. No. 4,866,005 and its reissue U.S. Pat. No. RE 34,861, for which the present assignee is the exclusive licensee. The growth of the remainder of the device in an exemplary and preferred embodiment is set forth in Table 1.

TABLE 1

| | | Layer | Thickness (A unless noted) | | Temperature (C.) | | | Al% | | In % | |
|---|---|---|---|---|---|---|---|---|---|---|---|
| | # | Description | range | preferred | range | preferred | Conductivity | range | preferred | range | preferred |
| 5 period MQW | 35 | p-GaN | 0.1–0.3 um | 0.18 um | 900–1020 | 980 | p | | | 0–10 | 0 |
| (range = 1–10 wells) | 34 | p-AlGaN | 0–300 | 85 | 850–1020 | 900 | p | 0–40 | 22 | | |
| | 33 | AlGaN | 0–100 | 30 | 850–1020 | 900 | nid[a] | 0–60 | 40 | | |
| | 32 | GaN | 0–200 | 80 | 700–900 | 820 | nid | 0–15 | 0 | 0–15 | 0 |
| | 43a | GaN | 0–100 | 25 | 700–900 | 770 | nid | 0–15 | 0 | 0–15 | 0 |
| | 42 | InGaN | 10–50 | 25 | 700–900 | 770 | nid | | | 5–30 | 15 |
| | 43c | GaN | 0–100 | 35 | 700–900 | 820 | nid | 0–15 | 0 | 0–15 | 0 |
| | 43b | GaN | 0–300 | 35 | 700–900 | 820 | n | 0–15 | 0 | 0–15 | 0 |
| | 30 | GaN | 50–400 | 250 | 700–900 | 820 | n | 0–15 | 0 | 0–15 | 0 |
| 10 period Superlattice | 41 | GaN | 5–100 | 30 | 700–900 | 780 | n | 0–15 | 0 | 0–15 | 0 |
| (range = 2–50 periods) | 40 | InGaN | 5–40 | 15 | 700–900 | 780 | n | 0–15 | 0 | 5–50 | 15 |
| | 25 | GaN | 1–4 um | 3 um | 1000–1150 | 1090 | n | | | | |
| | 26 | SiN | discontinuous | | 200–1100 | 700 | n | | | | |
| | 22 | AlGaN | 0–0.5 um | 0.3 um | 800–1050 | 1000 | n | 5–25 | 12 | | |
| | 24 | Dot Cap | discontinuous | | 800–1000 | 910 | n | 5–25 | 12 | | |
| | 23 | Dot Cap | discontinuous | | 800–1000 | 910 | n | | | | |
| | 21 | SiC Substrate | 2.6 um | 3.6 um | | | n | | | | |

[a]not intenionally doped

Table 1 is oriented similarly to FIG. 2. The numbers in parentheses represent acceptable ranges and the numbers outside the parentheses represent preferred values. Thus, the growth steps start at the bottom of the table and work toward the top. The first step is to add the GaN dots 23 and their AlGaN caps 24 to the substrate 21. The composition of the AlGaN caps is $Al_XGa_{1-X}$ in which $1 \geq X \geq 0$, with X being between about 5 and 15 in preferred embodiments.

The aluminum gallium nitride buffer layer 22 is next grown to a thickness of about 3,000 Å at a temperature of about 1,000° C.

The Group III nitrides are preferably grown using metal-organic chemical vapor deposition (MOCVD). The general nature of MOCVD is well understood in this art and the steps recited herein can accordingly be practiced by those of ordinary skill in this art without undue experimentation. As noted earlier, the sophisticated nature of the technique will, however, normally require specific adjustments based on individual equipment and set-ups.

Following completion of the AlGaN buffer layer 22, the discontinuous layer of silicon nitride 26 is grown on the buffer layer 22 at a temperature of about 700° C. The $Si_3N_4$ can be deposited in situ or ex situ, and over a temperature range of 200–1100° C. The temperature should be low enough to help control (and in particular slow) the growth rate and thus control the quality and thickness of the discontinuous silicon nitride layer. Temperatures of about 700° C. are preferred. At higher temperatures, the layer tends to form more quickly making the growth and thickness somewhat, but not excessively, more difficult to control.

Following the growth of the buffer layer 22, and the discontinuous silicon nitride layer 26, the gallium nitride n-type layer 25 is grown using a series of steps. In particular, the purpose of the discontinuous layer of silicon nitride is to permit and encourage the growth technique referred to as "epitaxial lateral overgrowth" (or "ELO") in which the GaN first grows on the surface of the buffer layer 22, but not on the $Si_3N_4$ portions. As upward growth from the buffer layer 22 proceeds adjacent the $Si_3N_4$ portions, the GaN tends to grow laterally across the $Si_3N_4$ portions. Because defects tend to propagate more easily vertically than horizontally, the lateral portions—and the vertical growth that follows— tend to exhibit reduced defect density. In a first part of this growth, a GaN layer approximately 30,000 Å thick is grown at about 1,090° C. (or a functionally equivalent temperature range), a temperature that encourages faster lateral growth and thus facilitates defect reduction. Specifically, the epitaxial lateral overgrowth of gallium nitride coalesces faster on the silicon nitride at such temperature. Exemplary (but not limiting) epitaxial lateral overgrowth techniques are set forth in U.S. Pat. Nos. 6,177,168 and 6,051,849 which are incorporated entirely herein by reference.

As Table 1 indicates, in preferred embodiments the superlattice includes between about 2 and 50 periods (10 periods being exemplary) formed by the indium gallium nitride 15 Å layer 42, and the gallium nitride 30 Å layer 43, both of which are doped n-type with silicon (Si). If desired, however, layers 42 and 43 can be undoped.

Following growth of the superlattice 27, the n-type gallium nitride layer 30 is grown in two steps. As Table 1 indicates, the first portion of layer 30 having a thickness of about 250 Å is grown with silicon doping at a temperature of about 820° C. A smaller, narrower portion of the layer is then grown without doping to help make sure that the undoped indium gallium nitride layer in the multiple quantum well 31 is segregated as much as possible from the silicon doping in the n-type layer 30.

The multiple quantum well 31 is then grown in the following fashion. First, the relatively thin approximately 25 Å undoped indium gallium nitride layer 42 is grown at a temperature of 770° C. following which a relatively thin undoped portion of GaN of about 25 Å is grown also at 770°. This is followed by a silicon doped portion of gallium nitride that is grown at the somewhat higher temperature of 820° C. to help increase the crystal quality of the gallium nitride. Stated differently, for gallium nitride layers above or near to indium gallium nitride layers, somewhat lower temperatures are preferred to protect the indium gallium nitride layers. Whenever possible, however, the gallium nitride is preferably grown at a somewhat higher temperature to improve its crystal quality.

In a functional sense, the temperatures used can be described as follows: The InGaN is grown at a first temperature that is low enough to incorporate the desired (but not an excessive) amount of indium, while high enough to get high quality growth for the amount of indium desired.

Next, a GaN layer is grown at this same first temperature to thereby cover the InGaN without undesirably heating the InGaN above the first temperature.

Next, the GaN layer is extended by growth at a second temperature that is higher than the first temperature. The second temperature is selected to be high enough to encourage higher quality growth of the GaN, but low enough to avoid degrading the nearby (though nonadjacent) InGaN well.

Next, another portion of the gallium nitride layer of approximately 35 Å is grown at the 840° C. temperature, but without doping for the same reasons stated earlier; i.e., to protect the next InGaN layer from unintentional doping.

After the appropriate number of quantum wells are included, the quantum well portion 31 is finished with one final well of indium gallium nitride layer of about 25 Å thickness, again grown at about 770° C., and one final relatively thin layer of undoped gallium nitride, also grown at 770° C. to a thickness of about 25 Å.

Following completion of the MQW 31, the undoped GaN layer 32 is grown to a layer of about 80 Å at a temperature of about 820° C. and forms the cap on the last well. In an alternative embodiment, the GaN layer 32 can be doped with magnesium or silicon.

As the next step, the undoped AlGaN layer 33 is grown. This layer prevents as many electrons as possible from reaching the p-AlGaN and p-GaN layers 34 and 35 adjacent to the contact 36 and thus preventing such electrons from creating any undesirable emissions or diode behavior. The undoped AlGaN layer 33 is grown to a thickness of about 30 Å at a temperature of about 890° C.

The p-AlGaN layer 34 is next grown to a thickness of about 85 Å at a temperature of about 890° C. and is preferably doped with magnesium. Finally, the p-type GaN contact layer 35 is formed to a thickness of about 1800 Å at a temperature of about 980° C., again representing a somewhat higher temperature to improve the growth and crystal quality while refraining from overheating the InGaN portions of the device. The p-GaN contact layer 35 is likewise doped with magnesium. The p-type layers 34 and 35 provide the hole injection required for operation of the device. Although the preferred embodiment incorporates p-AlGaN and p-GaN for layers 34 and 35 respectively, these layers can be formed of the other Group III nitrides provided that they are incorporated in a manner consistent with the structure and function of the overall device.

In another aspect, the invention is a light emitting device that incorporates the UV LED with an appropriate phosphor to produce a desired visible output. Materials that fluoresce or phosphoresce in response to UV radiation (regardless of source) are generally well known in the relevant arts. For example, common fluorescent lights operate on the same principle; i.e., a portion of the bulb or fixture generates a UV emission that in turn excites a phosphor that emits visible white light. Exemplary phosphors that produce white (or near-white) emission in response to UV radiation are generally well known and understood in this art, and can be selected and incorporated without undue experimentation. Furthermore, it will be understood that although white light is an exemplary goal, other colors can be produced in this manner using other relevant phosphors, and the invention is not limited to the production of white light.

That which is claimed is:

1. A light omitting diode comprising:

a silicon carbide substrate having a first conductivity type;

a first gallium nitride layer above said SiC substrate having the same conductivity type as said substrate;

a superlattice on said GaN layer formed of a plurality of repeating sets of alternating layers selected from the group consisting of GaN, $In_xGa_{1-x}N$, where 0<x<1, and $Al_xIn_yGa_{1-x-y}N$, where 0<x<1 and 0<y<1 and 0<x+y<1;

a second GaN layer on said superlattice baying the same conductivity type as said first GaN layer;

a multiple quantum well on said second GaN layer;

a third GaN layer on said multiple quantum well;

a contact structure on said third GaN layer having the opposite conductivity type from said substrate and said first GaN layer;

an ohmic contact to said SiC substrate; and an ohmic contact to said contact structure.

2. An LED according to claim 1 wherein said SiC substrate is the 6H polytype of SiC.

3. An LED according to claim 1 wherein said SiC substrate is the 4H polytype of SiC for avoiding undesired absorption in the ultraviolet wavelengths.

4. An LED according to claim 1 wherein said SiC substrate and said first GaN layer have n-type conductivity.

5. An LED according to claim 1 and further comprising a buffer layer on said SiC substrate for providing a crystal and electronic transition between said substrate and the remainder of said LED.

6. An LED according to claim 5 wherein said buffer layer comprises $Al_xGa_{1-x}N$ in which $1 \geq x \geq 0$.

7. An LED according to claim 5 wherein said buffer layer comprises a plurality of GaN dots on the surface of said SiC substrate.

8. An LED according to claim 7 wherein said GaN dots on the surface of said SiC substrate are covered with $Al_xGa_{1-x}N$ caps, where $1>x>0$.

9. An LED according to claim 5 further comprising a discontinuous layer of $Si_3N_4$ between said superlattice and said buffer layer for reducing the propagation of defects that tend to originate in said substrate.

10. An LED according to claim 1 wherein said superlattice comprises a plurality of periods of alternating layers of GaN and $In_xGa_{1-x}N$ where $0<x<1$.

11. An LED according to claim 1 wherein said superlattice includes between two and 50 periods of said alternating layers.

12. An LED according to claim 10 wherein said $In_xGa_{1-x}N$ layers are about 15 Angstroms thick and said GaN layers are about 30 Angstroms thick and wherein both said layers are doped n-type with silicon.

13. An LED according to claim 1 wherein said superlattice comprises a plurality of periods of alternating layers of $In_xGa_{1-x}N$ and $In_yGa_{1-y}N$, where $0<x<1$ and $0<y<1$ and x does not equal y.

14. An LED according to claim 1 wherein said superlative is formed of a plurality of periods of alternating layers of $Al_xGa_{1-x}N$ and $Al_yGa_{1-y}N$, where $0<x<1$ and $0<y<1$ and x does not equal y.

15. An LED according to claim 1 wherein said second GaN layer comprises a doped portion and an undoped portion for protecting the multiple quantum well from undesired doping.

16. An LED according to claim 15 wherein said doped portion of said second GaN layer is immediately adjacent to said superlative and said undoped portion of said second GaN layer is immediately adjacent to said multiple quantum well.

17. An LED according to claim 1 wherein said multiple quantum well comprises a plurality of repetitions of a basic structure formed of a layer of $In_xGa_{1-x}N$, where $0<x <1$ and a layer of GaN.

18. An LED according to claim 17 wherein at least one of said $In_xGa_{1-x}N$ layers is undoped.

19. An LED according to claim 1 wherein said multiple quantum well comprises alternating layers of $In_xGa_{1-y}N$ and $In_yGa_{1-y}N$, where $1 \geq x \geq 0$ and $1 \geq y \geq 0$ and where x does not equal y.

20. An LED according to claim 19 wherein at least one of said $In_xGa_{1-x}N$ and said $In_yGa_{1-y}N$ layers is undoped.

21. An LED according to claim 1 wherein said multiple quantum well comprises alternating layers of $In_xGa_{1-x}N$ where $0<x<1$ and $Al_xIn_yGa_{1-x-y}N$, where $0<x<1$ and $0<y<1$ and $0<x+y<1$.

22. An LED according to claim 21 wherein at least one of said $In_xGa_{1-x}N$ layers is undoped.

23. An LED according to claim 17 wherein x is equal to about 0.15 in said alternating $In_xGa_{1-x}N$ layers.

24. An LED according to claim 17 wherein at least one of said GaN layers in said MQW comprises a first portion of doped GaN and a second portion of undoped GaN with said undoped portion being immediately adjacent to at least one of said undoped $In_xGa_{1-x}N$ layers.

25. An LED according to claim 1 wherein said multiple quantum well includes at least three quantum wells.

26. An LED according to claim 1 wherein said multiple quantum well includes at least five quantum wells.

27. An LED according to claim 1 wherein said multiple quantum well includes at least seven quantum wells.

28. An LED according to claim 25 wherein the thickness of each said well is no more than about 50 Angstroms.

29. An LED according to claim 25 wherein the thickness of each said well is about 25 Angstroms.

30. An LED according to claim 17 wherein $0<1<0.3$ in said $In_xGa_{1-x}N$ layers in said multiple quantum well.

31. An LED according to claim 17 wherein $0<x<0.15$ in said $In_xGa_{1-x}N$ layers in said multiple quantum well.

32. An LED according to claim 17 wherein x is such that said multiple quantum well produces a photon in the ultraviolet region of the electromagnetic spectrum.

33. An LED according to claim 19 wherein x and y are such that said multiple quantum well produces a photon in the ultraviolet region of the electromagnetic spectrum.

34. An LED according to claim 20 wherein x is such that said multiple quantum well produces a photon in the ultraviolet region of the electromagnetic spectrum.

35. An LED according to claim 1 wherein said multiple quantum well emits a peak wavelength of between about 370 nanometers and 420 nanometers.

36. An LED according to claim 1 wherein said contact structure comprises a p-type GaN contact layer.

37. An LED according to claim 36 wherein said contact structure further comprises at least one layer of $Al_xGa_{1-x}N$ where $0<x<1$ adjacent to said p-type GaN contact layer and opposite to said ohmic contact with respect to said p-type contact layer.

38. An LED according to claim 36 wherein said contact structure comprises an undoped $Al_xGa_{1-x}N$ layer, where $0<x<1$, on said third GaN layer and a p-type $Al_xGa_{1-x}N$ layer, where $0 \leq x \leq 1$, on said undoped $Al_xGa_{1-x}N$ layer.

39. An LED according to claim 1 wherein said third layer of GaN is doped with magnesium to produce a p-type conductivity.

40. An LED according to claim 1 wherein said third layer of GaN is doped with silicon to produce an n-type conductivity.

41. An LED according in claim 4 wherein said contact structure comprises a p-type layer of $Al_xGa_{1-x}N$, where $0<x<1$.

42. An LED according to claim 4 wherein said contact structure comprises a p-type layer of $In_xGa_{1-x}N$, where $0<x<1$.

43. An LED according to claim 4 wherein said contact structure comprises a p-type Group III nitride superlattice.

44. Am LED according to claim 1 wherein
said multiple quantum well emits in the ultraviolet portion of the electromagnetic spectrum and further comprising;
a phosphor responsive to the ultraviolet radiation that produces a visible photon in response to the ultraviolet photon emitted by said multiple quantum well.

45. A pixel comprising:
a red light emitting diode;
a green light emitting diode; and
a light emitting diode according to claim 1.

46. A display comprising a plurality of pixels according to claim 45.

47. An LED lamp comprising a pixel according to claim 45.

48. An LED comprising:
a SiC substrate consisting of the 4H polytype of SiC having an n-type conductivity;
an $Al_xGa_{1-x}N$ buffer layer, where $0<x<1$, on said SiC substrate;
a first GaN layer above said SiC substrata having the same conductivity type as said substrate;
a superlattice on said first GaN layer consisting of a plurality of repeating periods of alternating layers of GaN and $In_xGa_{1-x}N$, where $0<x<1$.
a second GaN layer on said superlattice having the same conductivity type as said first GaN layer;
a multiple quantum well on said second GaN layer,
a third GaN layer on said multiple quantum well;
a contact structure on said third GaN layer having the opposite conductivity type from said SiC substrate and said first GaN layer;
an ohmic contact to said SiC substrate; and
an ohmic contact to said contact structure.

49. An LED according to claim 48 wherein said buffer layer comprises a plurality of GaN dots on the surface of said SiC substrate.

50. An LED according to claim 49 wherein said GaN dots are covered with $Al_xGa_{1-x}N$ caps, where $0<x<1$.

51. An LED according to claim 48 further comprising a discontinuous layer of $Si_3N_4$ between said superlattice end said buffer layer for reducing the propagation of defects that tend to originate in said substrata.

52. An LED according to claim 48 wherein, said superlattice includes between two and fifty periods of said alternating layers of GaN and $In_xGa_{1-x}N$.

53. An LED according to claim 48 wherein said $In_xGa_{1-x}N$ layers are about 15 Angstroms thick and said GaN layers are about 30 Angstroms thick and wherein both said layers are n-type.

54. An LED according to claim 48 wherein said second GaN layer comprises a doped portion and an undoped portion for protecting the multiple quantum well from undesired doping.

55. An LED according to claim 54 wherein said doped portion of said second GaN layer is immediately adjacent to said superlattice.

56. An LED according to claim 54 wherein said undoped portion of said second GaN layer is immediately adjacent to said multiple quantum well.

57. An LED according to claim 48 wherein said multiple quantum well comprises a plurality of repetitions of a basic structure formed of a layer of $In_xGa_{1-x}N$, where $0<x<1$, and a layer of GaN.

58. An LED according to claim 57 wherein said $In_xGa_{1-x}N$ layers are undoped.

59. An LED according to claim 57 wherein, x is equal to about 0.15 in said alternating $In_xGa_{1-x}N$ layers.

60. An LED according to claim 58 wherein said GaN layers in said multiple quantum well consist of a first portion of doped GaN and a second portion of undoped GaN with said undoped portion being immediately adjacent to at least one of said undoped $In_xGa_{1-x}N$ layers.

61. Au LED according to claim 57 wherein said multiple quantum well consists of at least three quantum wells.

62. An LED according to claim 57 wherein the thickness of each said well is about 25 Angstroms.

63. An LED according to claim 48 wherein said third GaN layer is undoped.

64. An LED according to claim 48 wherein said contact structure comprises a p-type GaN contact layer adjacent to said ohmic contact.

65. An LED according to claim 48 wherein said canted structure comprises an undoped $Al_xGa_{1-x}N$ layer, where $0<x<1$, on said third GaN layer and a p-type $Al_xGa_{1-x}N$ layer, where $0\leq x\leq 1$, on said undoped $Al_xGa_{1-x}N$ layer.

66. A pixel comprising:
a red light emitting diode;
a green light emitting diode; and
A light emitting diode according to claim 48.

67. A display comprising a plurality of pixels according to claim 66.

68. An LED lamp comprising a pixel according to claim 66.

69. An LED comprising:
a SiC substrate consisting of the 4H polytype of SiC having an n-type conductivity;
a plurality of GaN dots on the surface of said SiC substrate, said dots being covered with $Al_xGa_{1-x}N$ caps, where $0<x<1$;
an $Al_xGa_{1-x}N$ buffer layer, where $0<x<1$, on said SiC substrate and said dots;
a discontinuous layer of $Si_3N_4$ on said buffer layer for reducing the propagation of defects that tend to originate in said SiC substrate;
a first GaN layer on said buffer and said discontinuous layer and having the same conductivity type as said substrate;
a superlattice on said first GaN layer comprising between two and fifty periods of alternating layers of GaN and $In_xGa_{1-x}N$, where $0<x<1$ and where said $In_xGa_{1-x}N$ layers are about 10 Angstroms thick and said GaN layers are about 20 Angstroms thick and wherein both said layers are doped n-type;
a second GaN layer on said superlattice consisting of a doped portion and an undoped portion having the same conductivity type as said first GaN layer and wherein said doped portion is immediately adjacent to said superlattice and said undoped portion is immediately adjacent to said doped portion;
a multiple quantum well on said second GaN layer comprising at least three repetitions of a basic structure formed of a layer of undoped $In_xGa_{1-x}N$, where x is equal to about 0.15, and a layer of GaN, and wherein said $In_xGa_{1-x}N$ layers are about 25 Angstroms thick and wherein said GaN layers consist of a first portion of doped GaN and a second portion of undoped GaN with said undoped portion being immediately adjacent to at least one of said undoped $In_xGa_{1-x}N$ layers;
a third undoped GaN layer on said multiple quantum well;
a contact structure on said third GaN layer having the opposite conductivity type from said SiC substrate and said first GaN layer and wherein said contact structure comprises an undoped $Al_xGa_{1-x}N$ layer, where $0<x<1$, on said third GaN layer and a p-type $Al_xGa_{1-x}N$ layer, where $0\leq x\leq 1$, on said undoped $Al_xGa_{1-x}N$ layer;
a p-type contact layer of GaN on said contact structure
an ohmic contact to said SiC substrate; and
an ohmic contact to said contact structure.

70. A pixel comprising:
a red light emitting diode;
a green light emitting diode; and
a light emitting diode according to claim 69.

71. A display comprising a plurality of pixels according to claim 70.

72. An LED lamp comprising a pixel according to claim 70.

* * * * *

UNITED STATES PATENT AND TRADEMARK OFFICE
CERTIFICATE OF CORRECTION

PATENT NO. : 6,664,560 B2
DATED : December 16, 2003
INVENTOR(S) : David Todd Emerson et al.

It is certified that error appears in the above-identified patent and that said Letters Patent is hereby corrected as shown below:

<u>Title page,</u>
Item [56], References Cited, OTHER PUBLICATIONS, "Nakamura,, Shuki" should read -- Nakamura, Shuji --.

<u>Column 10,</u>
Line 52, "omitting" should read -- emitting --.
Line 60, "baying" should read -- having --.

<u>Column 11,</u>
Line 13, "$1 \bullet x \bullet 0$" should read -- $1 > x > 0$ --.
Lines 37 and 46, "superlative" should read -- superlattice --.
Line 55, "InxGa1-yN" should read -- InxGa1-xN --;
Line 56, "$1 \bullet x \bullet 0$ and $1 \bullet y \bullet 0$" should read -- $1 > x > 0$ and $1 > y > 0$ --.

<u>Column 12,</u>
Line 38, "$0 \bullet x \bullet 1$" should read -- $0 < x < 1$ --.
Line 45, "in" should read -- to --.
Line 53, "Am" should read -- An --.

<u>Column 13,</u>
Lines 6 and 28, "substrata" should read -- substrate --.
Line 57, "Au" should read -- An --.
Line 66, "canted" should read -- contact --;

<u>Column 14,</u>
Lines 2 and 53, "$0 \bullet x \bullet 1$" should read -- $0 < x < 1$ --.

Signed and Sealed this

Twenty-second Day of June, 2004

JON W. DUDAS
*Acting Director of the United States Patent and Trademark Office*